United States Patent
Wang et al.

(10) Patent No.: US 9,530,692 B2
(45) Date of Patent: Dec. 27, 2016

(54) METHOD OF FORMING THROUGH WIRING

(71) Applicant: CANON KABUSHIKI KAISHA, Tokyo (JP)

(72) Inventors: Shinan Wang, Komae (JP); Hideshi Kawasaki, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/616,891

(22) Filed: Feb. 9, 2015

(65) Prior Publication Data

US 2015/0235899 A1    Aug. 20, 2015

(30) Foreign Application Priority Data

Feb. 18, 2014   (JP) ................................ 2014-028270

(51) Int. Cl.
*H01L 21/768* (2006.01)
*H01L 21/3065* (2006.01)
*B06B 1/02* (2006.01)

(52) U.S. Cl.
CPC ........ *H01L 21/76898* (2013.01); *B06B 1/0292* (2013.01)

(58) Field of Classification Search
CPC ................................................ H01L 21/76873
See application file for complete search history.

(56) References Cited

U.S. PATENT DOCUMENTS

| | | | |
|---|---|---|---|
| 2011/0168908 A1* | 7/2011 | Wang | B81C 1/00619 250/370.09 |
| 2012/0153430 A1* | 6/2012 | Bachman | H01L 21/76224 257/508 |
| 2012/0276733 A1* | 11/2012 | Saeki | H01L 21/76898 438/613 |
| 2013/0015585 A1* | 1/2013 | Kosenko | H01L 23/481 257/774 |
| 2013/0118793 A1 | 5/2013 | Teshima et al. | |
| 2014/0117394 A1* | 5/2014 | Kim | G02B 19/0014 257/98 |

FOREIGN PATENT DOCUMENTS

JP    2012-28533 A    2/2012

* cited by examiner

*Primary Examiner* — Duy T Nguyen
*Assistant Examiner* — Mounir Amer
(74) *Attorney, Agent, or Firm* — Fitzpatrick, Cella, Harper & Scinto

(57) ABSTRACT

Provided is a method of forming a through wiring, including forming a first insulating film on a first surface and a second surface of a substrate; forming a through hole to pass through the first insulating film formed on the first surface side and the substrate; forming a second insulating film formed from a material different from that of the first insulating film on an inner wall of the through hole; forming a conductive film on the first insulating film formed on the second surface; forming an opening in the first insulating film by processing the first insulating film formed on the second surface; and filling an inner portion of the through hole with a conductive material by electrolytic plating using the conductive film exposed at the bottom portion of the through hole as a seed layer.

26 Claims, 2 Drawing Sheets

METHOD OF FORMING THROUGH WIRING

BACKGROUND OF THE INVENTION

Field of the Invention

The present invention relates to a method of forming a through wiring (through electrode) passing through a substrate, such as a semiconductor substrate, in the thickness direction. A substrate having this through wiring can be used to manufacture a capacitive transducer to be used as an ultrasonic transducer.

Description of the Related Art

As represented by an LSI, there is a need for a system of an integrated circuit and the like to have higher speed and higher functionality. In order to increase the speed and functionality of such an integrated circuit system, chip mounting technology using a three-dimensional structure is needed. Therefore, in the related art, a substrate through electrode capable of electrically connecting chips at a minimum distance has been used. The through electrode is formed by forming a through hole passing through the substrate, then filling the interior of the through hole with metal, and electrically connecting a substrate with the substrates stacked above and below that substrate via the metal. A common method for filling the metal into the interior of the through hole is electrolytic plating. When the through hole has a high aspect ratio, bottom-up electrolytic plating, in which a seed layer is formed on one end of the through hole, is effective in order to obtain a highly reliable through electrode. In Japanese Patent Application Laid-Open No. 2012-28533, there is disclosed a method for facilitating formation and removal of a seed layer. In this method, an insulating film and a conductive member are formed in order on one surface of a substrate, and then a through hole is formed from the opposite surface of the substrate using the conductive member as an etch stop layer. After formation of the through hole, a through electrode is formed by bottom-up electrolytic plating on the through hole using the conductive member as a seed layer.

However, in the method disclosed in Japanese Patent Application Laid-Open No. 2012-28533, the formation method and the formation conditions of the insulating film may be limited due to the insulating film being formed on an inner wall of the through hole in a state in which the seed layer is present. For example, when the temperature of the substrate is increased during formation of the insulating film on the inner wall of the through hole, the material of the seed layer may diffuse into the insulating film adhered to the seed layer, causing the properties of the insulating film to deteriorate. Further, depending on the formation conditions of the insulating film, the material of the seed layer can pass through the insulating film, and diffuse into an inner portion of the substrate. Accordingly, the insulating film on the inner wall of the through hole is formed at a low temperature in many cases. On the other hand, at a low temperature, it is difficult to form a high-quality insulating film, such as a silicon thermal oxidation film. In addition, in the method disclosed in Japanese Patent Application Laid-Open No. 2012-28533, during etching carried out to expose the seed layer at a bottom portion of the through hole, the insulating film on the inner wall, which is formed of the same material as the etching target, suffers damage, which can cause insulating properties to deteriorate.

SUMMARY OF THE INVENTION

In view of the above-mentioned problems, according to one embodiment of the present invention, there is provided a method of forming a through wiring in a substrate using electrolytic plating, the method including: forming a first insulating film on a first surface and a second surface of the substrate, the first surface and the second surface facing each other; forming a through hole to pass through the first insulating film formed on the first surface side and the substrate so that at least a part of the first insulating film formed on the second surface remains; forming a second insulating film on an inner wall of the through hole, the second insulating film being formed from a material different from a material of the first insulating film; forming a conductive film on the first insulating film formed on the second surface; forming an opening in each of the first insulating film by processing the first insulating film formed on the second surface from the first surface side so that the conductive film is exposed at a bottom portion of the through hole; and filling an inner portion of the through hole with a conductive material by electrolytic plating using the conductive film exposed at the bottom portion of the through hole as a seed layer.

Further features of the present invention will become apparent from the following description of exemplary embodiments with reference to the attached drawings.

DESCRIPTION OF THE EMBODIMENTS

In a method of forming a through wiring according to the present invention, a through hole is formed to pass through a first insulating film formed on a first surface side of a substrate and the substrate so that at least a part of a first insulating film formed on a second surface remains, and a second insulating film is formed on an inner wall of the through hole, the second insulating film being formed from a material different from that of the first insulating film. Then, a conductive film is formed on the first insulating film formed on the second surface, and an opening is formed by processing the first insulating film formed on the second surface so that the conductive film is exposed at a bottom portion of the through hole. Then, an inner portion of the through hole is filled with a conductive material by electrolytic plating using the conductive film exposed at the bottom portion of the through hole as a seed layer. Typically, the step of forming the second insulating film is carried out before the step of forming the conductive film.

Embodiments of the present invention are described below with reference to the drawings.

(First Embodiment)

A method of forming a through wiring according to a first embodiment of the present invention is described with reference to FIGS. 1A to 1H. FIGS. 1A to 1H are cross-sectional views illustrating this embodiment. For ease of viewing, in FIGS. 1A to 1H, only two through holes and through wirings are illustrated.

Figure 1E:
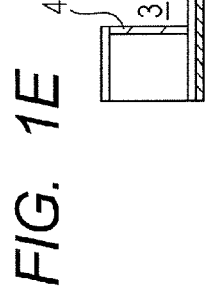
FIGS. 1A, 1B, 1C, 1D, 1E, 1F, 1G, and 1H are cross-sectional views illustrating an example of a method of forming a through wiring according to the present invention.
Figure 1F:
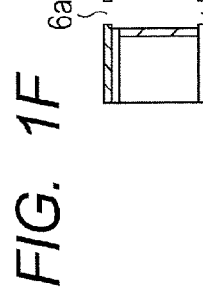
Figure 1G:
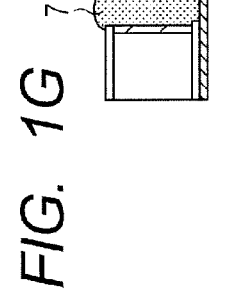
Figure 1H:
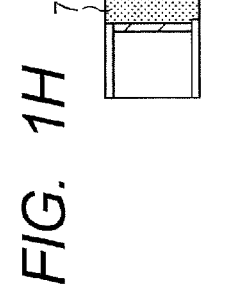
Figure 1A:
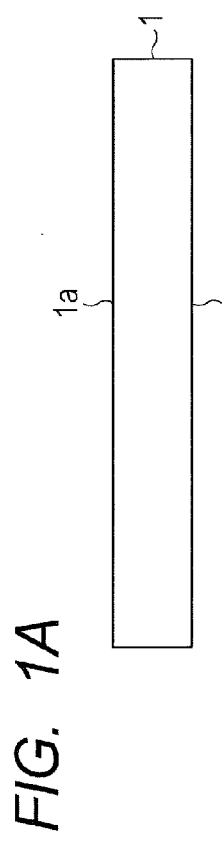

First, as illustrated in FIG. 1A, a substrate 1 is prepared. The substrate 1 is a semiconductor substrate. For example, the substrate 1 is a silicon substrate. The substrate 1 includes a first surface 1a and a second surface 1b that face each other. The thickness of the substrate 1 is, for example, from 50 μm to 1,000 μm. A processing step is described below based on an example in which the substrate 1 is a silicon substrate.

Figure 1B:
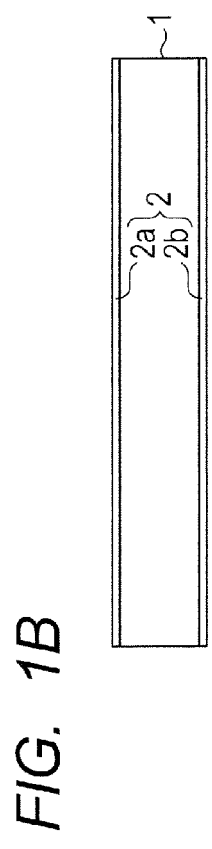

Next, as illustrated in FIG. 1B, first insulating film 2 are formed on the first surface 1*a* and the second surface 1*b* of the substrate 1. A first insulating film 2*a* is formed on the first surface 1*a*, and a first insulating film 2*b* is formed on the second surface 1*b*. The insulating film 2*a* and the insulating film 2*b* may be formed simultaneously or separately. Further, the insulating film 2*a* and the insulating film 2*b* may have the same structure or thickness, or different structures or thicknesses. The first insulating film 2 (including 2*a* and 2*b*; hereinafter the same) are formed of, for example, single layer film of a silicon nitride or a silicon oxide, or multilayer film of a silicon nitride and a silicon oxide. The thickness of the first insulating film 2 is, for example, from 0.1 μm to 1.5 μm. As a method of forming the silicon nitride, a chemical vapor deposition (CVD) method may be employed. As a method of forming the silicon oxide, thermal oxidation or a CVD method may be employed.

Figure 1C:
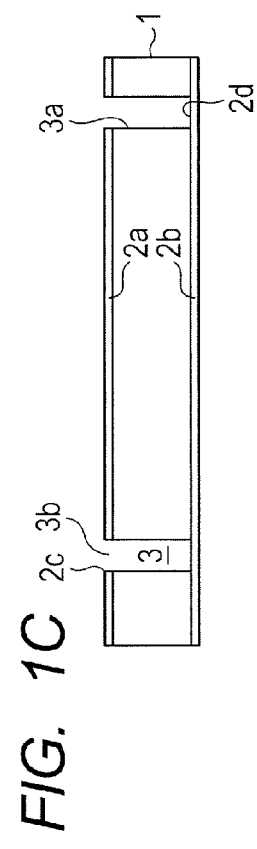

Next, as illustrated in FIG. 1C, a through hole 3 is formed. Processing of the through hole 3 is carried out from the first surface 1*a* side of the substrate 1. The shape, number, arrangement, and the like of the through hole 3 are defined by a photoresist pattern based on the application. For example, the through holes 3 each have a diameter of from 20 μm to 100 μm, and are arranged in an array having a period of 200 μm in a transverse direction and a period of 2 mm in a lengthwise direction. During processing of the through hole 3, for example, the first insulating film 2*a* and the substrate 1 are processed in order using a photoresist pattern (not shown) as an etching mask. The processing of the through hole 3 passing through the substrate 1 is carried out using, for example, a reactive ion etching (RIE) method. The first insulating film 2*a* includes an opening 2*c*. The through hole 3 includes an inner wall 3*a* and an opening 3*b*. A portion 2*d* of the first insulating film 2*b* is exposed at a bottom portion of the through hole by the formation of the through hole 3. During processing of the through hole 3, it is acceptable for the portion 2*d* of the first insulating film 2*b* to be slightly etched. However, the material and film thickness of the first insulating film 2*b* are determined in the step illustrated in FIG. 1B so that, during the processing of the through hole 3 and the subsequent steps, the portion 2*d* of the first insulating film 2*b* has a mechanical strength that is sufficient to prevent the portion 2*d* from breaking. After the processing of the through hole 3, the above-mentioned etching mask is removed by an appropriate method. It is preferred that the inner wall 3*a* of the through hole 3 be smooth. For example, it is preferred that the inner wall 3*a* of the through hole 3 have a surface roughness of 50 nm or less in a maximum height Rmax. After the RIE processing, if the inner wall 3*a* of the through hole 3 is not sufficiently smooth, it is preferred to carry out smoothening processing on the inner wall 3*a*. For example, the inner wall 3*a* can be made smoother by, after forming a silicon oxide film on the surface of the inner wall 3*a* by thermal oxidation, removing the silicon oxide film with a chemical such as hydrofluoric acid or buffered hydrofluoric acid (BHF). Further, heat treatment in a hydrogen atmosphere is also effective to smoothen the inner wall 3*a*.

Figure 1D:
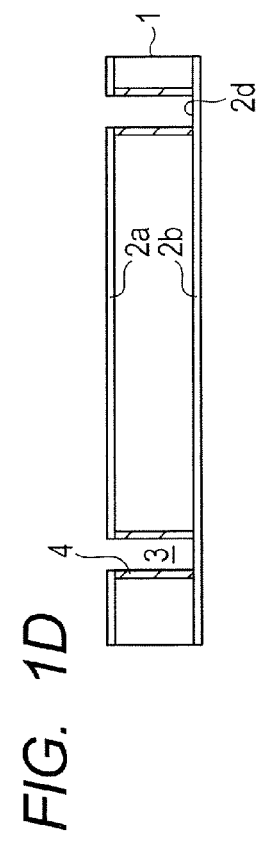

Next, as illustrated in FIG. 1D, a second insulating film 4 is formed on the inner wall 3*a* of the through hole 3 (refer to FIG. 1C). The second insulating film 4 is formed from a material different from that of the first insulating film 2 (in particular, the first insulating film 2*b*). For example, the first insulating film 2*b* is a silicon nitride film, and the second insulating film 4 is a silicon oxide film. Thus, the second insulating film 4 can be formed by thermal oxidation of silicon, for example. When formed by thermal oxidation of silicon, the second insulating film 4 is formed only on the inner wall 3*a* of the through hole 3 exposed in the steps carried out up to FIG. 1C. The thickness of the second insulating film 4 is determined based on the required performance. For example, the thickness of the second insulating film 4 is from 0.5 μm to 1.5 μm. To prevent thermal diffusion of the through wiring material into the substrate 1, the second insulating film 4 may be a multilayer film formed from two or more types of materials. By smoothening the inner wall 3*a* of the through hole 3 in the step illustrated in FIG. 1C, the second insulating film is less susceptible to defects forming, and is also stronger against stresses produced in a thermal process and the like.

Next, as illustrated in FIG. 1E, a conductive film 5 is formed on an upper surface of the first insulating film 2*b*. The conductive film 5 is, for example, a metal. To ensure close adhesion with the first insulating film 2*b*, the conductive film 5 may include an adhesion layer. The conductive film 5 is, for example, a bilayer film including, in order, 5 nm of Cr and 1 μm of Cu formed on an upper surface of the first insulating film 2*b*. Examples of a method of forming the conductive film 5 include sputtering, electron beam evaporation, resistance heating evaporation, and the like.

Next, as illustrated in FIG. 1F, an opening 2*e* is formed by processing the portion 2*d* of the first insulating film 2*b* (refer to FIG. 1E) so that, as seen from the opening 3*b* of the through hole (refer to FIG. 1C), a portion 5*a* of the conductive film 5 is exposed. The processing of the portion 2*d* of the first insulating film 2*b* is carried out in a way that prevents the second insulating film 4 from receiving a large amount of damage. Further, the opening 2*e* of the first insulating film 2*b* is set to be smaller than an inner diameter of the second insulating film 4 so that the silicon substrate 1 is not exposed in the through hole 3. Therefore, for example, the processing of the opening 2*e* is carried out from the first surface 1*a* side of the substrate 1 (refer to FIG. 1A) utilizing dry etching in which a dry film resist 6 is employed as a mask. An opening 6*a* of the dry film resist 6 is smaller than both the opening 2*c* of the first insulating film 2*a* (refer to FIG. 1C) and the opening 3*b* of the through hole 3 (refer to FIG. 1C). After the processing of the portion 2*d* of the first insulating film 2*b*, the etching mask (e.g., the dry film resist 6) is removed by an appropriate method.

Next, as illustrated in FIG. 1G, an inner portion of the through hole 3 is filled with a conductive material 7 by electrolytic plating using the conductive film 5 as a seed layer. To ensure the reliability of electrical connection with an electrode and the like of a subsequently manufactured device, the conductive material 7 is made to protrude from the opening 2*c* of the first insulating film 2*a* (refer to FIG. 1C). During the electrolytic plating, plating solution is circulated through the through hole from the opening 3*b* of the through hole 3, and the conductive material 7 grows from the portion 5*a* of the conductive film 5 as a starting point. The main component of the conductive material 7 is, for example, Cu. In this case, the plating of the conductive material 7 is, for example, Cu electrolytic plating in which copper sulfate is the main liquid. The plating is carried out in a manner that prevents the surface of the conductive film 5 from coming into contact with the plating solution so that plating does not grow on the surface of the conductive film formed on the outer side of the through hole 3. For example, the surface of the conductive film 5 formed on the outer side of the through hole 3 is protected with an insulating material.

Consequently, plating can grow only from the portion 5a of the conductive film 5 as the starting point, which means that plating efficiency is good.

Next, as illustrated in FIG. 1H, for the purpose of electrical connection with an electrode and the like of a subsequently manufactured device, both the first surface 1a side (refer to FIG. 1A) and the second surface 1b side (refer to FIG. 1A) of the substrate 1 are processed so that both end surfaces 7a and 7b of the conductive material 7 are exposed. The processing of the end surface 7a is carried out from the first surface 1a side using, for example, chemical mechanical polishing (CMP). By performing CMP, the end surface 7a is at roughly the same height as the surface of the first insulating film 2a. The processing of the end surface 7b is carried out for the purpose of removing the conductive film 5 and flattening the end surface 7b. CMP may also be employed for the processing of the end surface 7b. The resultant conductive material 7 whose end surfaces have been processed in this manner serves as the through wiring. Further, if it is necessary to smoothen the surface of the first insulating film 2, the first insulating film 2a and 2b are each processed using CMP after the end surfaces of the conductive material 7 are processed.

Through use of the steps described above, a semiconductor substrate having the through wiring 7 illustrated in FIG. 1H can be manufactured. In this manufacturing method, the second insulating film on the inner wall of the through hole is formed before the plating seed layer. Therefore, there are fewer limitations on the formation conditions of the second insulating film, and a processing method accompanied by high temperature can be utilized. As an example, a thermal oxidation film of silicon having excellent insulating properties can be easily formed as the second insulating film. Further, when a silicon nitride film having etching selectivity with respect to a silicon oxide film is used for the first insulating film on the seed layer, the second insulating film can be prevented from suffering almost any damage during the step of exposing the seed layer at the bottom portion of the through hole. Consequently, a highly reliable second insulating film can be easily obtained.

(Second Embodiment)

A method of forming a through wiring according to a second embodiment of the present invention is described with reference to FIGS. 2A to 2H. FIGS. 2A to 2H are cross-sectional views illustrating this embodiment. To avoid repetition, a detailed description of parts that are similar to the first embodiment is omitted. First, the same substrate 1 as illustrated in FIG. 1A is prepared. The forming method is described below based on an example in which the substrate 1 is a silicon substrate.

Figure 2A:
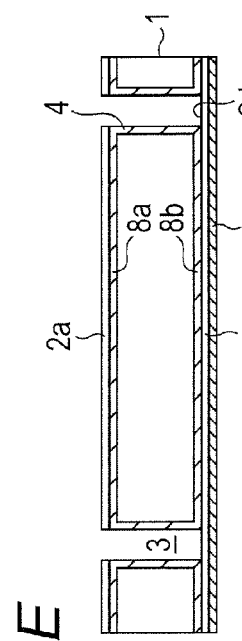
FIGS. 2A, 2B, 2C, 2D, 2E, 2F, 2G, and 2H are cross-sectional views illustrating another example of a method of forming a through wiring according to the present invention.

Next, as illustrated in FIG. 2A, an insulating film 8 (including 8a and 8b; hereinafter the same) and an insulating film 2 (including 2a and 2b; hereinafter the same) are formed in order on the first surface 1a (refer to FIG. 1A) and the second surface 1b (refer to FIG. 1A) of the substrate 1. An insulating film 8a and an insulating film 2a are each formed on the first surface 1a, and an insulating film 8b and an insulating film 2b are each formed on the second surface 1b. The first insulating film is formed by the insulating film 8 and the insulating film 2. In other words, in this embodiment, the first insulating film has a multilayer structure. The insulating film 8 is formed from an insulating material that is a material different from that of the insulating film 2. For example, the insulating film 8 is a silicon thermal oxidation film having a thickness of from 0.1 μm to 1.5 μm. In contrast, the insulating film 2 is a silicon nitride film having a thickness of from 0.1 μm to 0.5 μm. To prevent warping of the substrate 1 due to stress, it is desired that the insulating film 8a and the insulating film 8b be formed from the same material, have the same thickness, and be formed simultaneously. Further, it is also desired that the insulating film 2a and the insulating film 2b be formed from the same material, have the same thickness, and be formed simultaneously.

Figure 2B:
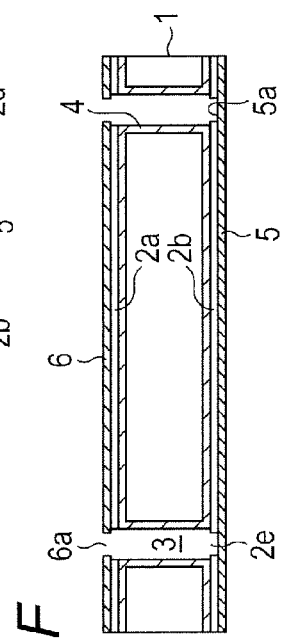

Next, as illustrated in FIG. 2B, the through hole 3 is formed. Processing of the through hole 3 is carried out from the first surface 1a side of the substrate 1 (refer to FIG. 1A). During processing of the through hole 3, for example, the insulating film 2a, the insulating film 8a, and the substrate 1 are processed in order using a photoresist pattern (not shown) as an etching mask. The processing of the through hole 3 passing through the substrate 1 is carried out using, for example, a reactive ion etching (RIE) method. The insulating film 2a includes the opening 2c and the insulating film 8a includes an opening 8c. The through hole 3 includes the inner wall 3a and the opening 3b. The opening 2c of the insulating film 2a, the opening 8c of the insulating film 8a and the opening 3b of the through hole 3 may have the same dimension. A portion 8d of the insulating film 8b is exposed at a bottom portion of the through hole by the formation of the through hole 3.

Figure 2C:
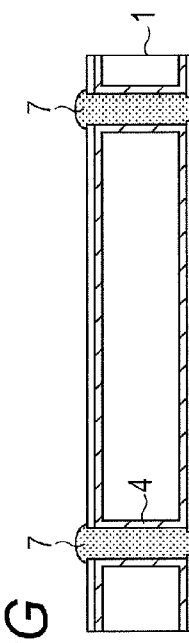

Next, as illustrated in FIG. 2C, the portion 8d of the insulating film 8b is processed so that the portion 2d of the insulating film 2b is exposed. The processing of the portion 8d of the insulating film 8b may be carried out using the same etching mask as that used in the processing of the through hole 3 illustrated in FIG. 2B.

Figure 2D:
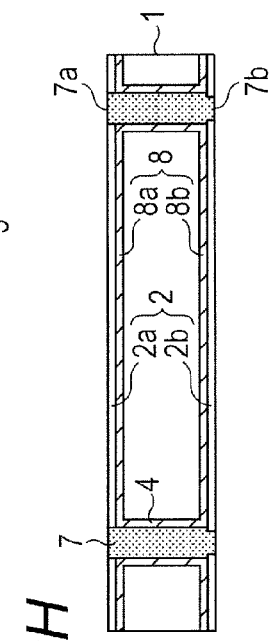

Next, as illustrated in FIG. 2D, the second insulating film 4 is formed on the inner wall 3a of the through hole 3 (refer to FIG. 2C). The second insulating film 4 is formed from a material different from that of the insulating film 2 (in particular, the insulating film 2b) of the first insulating film. However, the second insulating film 4 may be formed from the same material as the insulating film 8 of the first insulating film. For example, the insulating film 2b is a silicon nitride film, and the second insulating film 4 is a silicon oxide film. Thus, the second insulating film 4 can be formed by thermal oxidation of silicon, for example. In this case, the second insulating film 4 is formed only on the inner wall 3a of the through hole 3 exposed in the steps carried out up to FIG. 2C. The thickness of the second insulating film is determined based on the required performance. For example, the thickness of the second insulating film 4 is 1 μm.

Figure 2E:
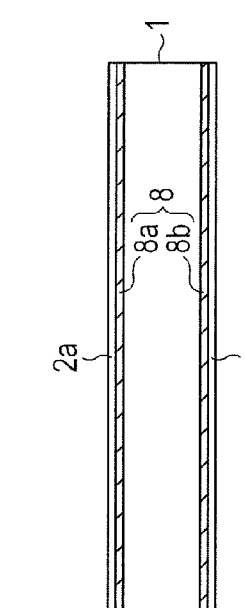

Next, as illustrated in FIG. 2E, the conductive film 5 is formed on the outer surface of the insulating film 2b form the second surface 1b side of the silicon substrate 1 (refer to FIG. 1A). The conductive film 5 is, for example, a metal. The configuration and the method of forming the conductive film 5 are the same as those described with reference to FIG. 1E.

Figure 2F:
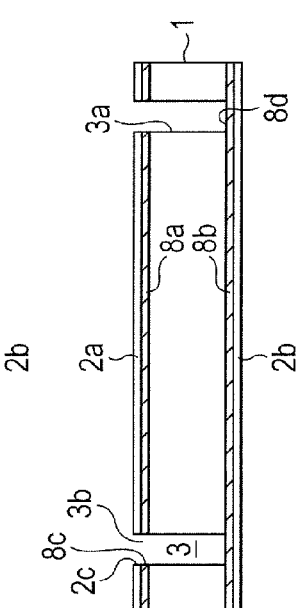

Next, as illustrated in FIG. 2F, the portion 2d of the insulating film 2b is processed so that, as seen from the opening 3b of the through hole (refer to FIG. 2C), the portion 5a of the conductive film 5 is exposed. The processing method is the same as the method described with reference to FIG. 1F. The diameter of the portion 5a of the conductive film 5 is smaller than the inner diameter of the through hole 3 including the second insulating film 4.

Figure 2G:
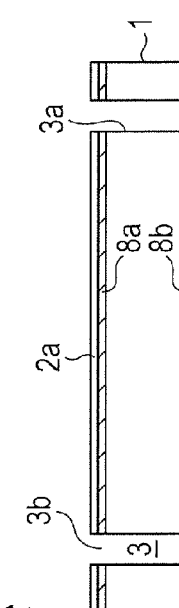

Next, as illustrated in FIG. 2G, the inner portion of the through hole 3 is filled with the conductive material 7 by electrolytic plating using the conductive film 5 as a seed layer. The plating method is the same as the method described with reference to FIG. 1G.

Figure 2H:
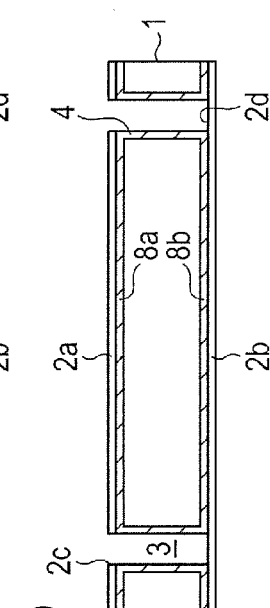

Next, as illustrated in FIG. 2H, for the purpose of electrical connection, both the end surfaces 7a and 7b of the conductive material 7 are processed. The processing method is the same as the method described with reference to FIG. 1H. The resultant conductive material 7 whose end surfaces have been processed in this manner serves as the through wiring.

Through use of the steps described above, a semiconductor substrate having the through wiring illustrated in FIG. 2H can be manufactured. This manufacturing method is capable of obtaining the same effects as in the manufacturing method described in the first embodiment. In addition, because thick first insulating film can be formed relatively easily on the surfaces (1a and 1b) of the substrate, a through wiring substrate having higher insulating resistance can be realized.

More detailed examples are described below.

EXAMPLE 1

Example 1 of the present invention, which is a detailed example of a method of forming a through wiring according to the present invention, is described with reference to FIGS. 1A to 1H. First, as illustrated in FIG. 1A, the silicon substrate 1 is prepared. The substrate 1 has a diameter of 4 inches, a thickness of 200 μm, and a resistivity of from 1 Ω·cm to 100 Ω·cm. The first surface 1a and the second surface 1b of the substrate 1 that face each other have the same level of specularity as a common commercially-available silicon substrate.

Next, as illustrated in FIG. 1B, the first insulating film 2 is formed on the first surface and the second surface of the substrate 1. The insulating film 2a on the first surface 1a and the insulating film 2b on the second surface 1b are both silicon nitrides each having a thickness of about 0.4 μm, and are simultaneously formed by a CVD method. Next, as illustrated in FIG. 1C, the through hole 3 is formed. Processing of the through hole 3 is carried out from the first surface 1a side of the silicon substrate 1. The through holes 3 each have a diameter of 50 μm, and are arranged in an array having a period of 200 μm in a transverse direction and a period of 2 mm in a lengthwise direction. During processing of the through hole 3, the first insulating film 2a formed of a silicon nitride and the silicon substrate 1 are subjected in order to RIE processing using a photoresist pattern (not shown) as an etching mask. The portion 2d of the first insulating film 2b is exposed at a bottom portion of the through hole by the formation of the through hole 3. The reactive gas and the processing conditions used in the RIE are different between the first insulating film 2a formed of a silicon nitride and the silicon substrate 1. The RIE conditions are set so that the portion 2d of the silicon nitride suffers almost no damage due to the formation of the through hole 3. After the processing of the through hole 3, the photoresist pattern used as the etching mask is removed by plasma asking.

Next, as illustrated in FIG. 1D, the second insulating film 4 is formed on the inner wall 3a of the through hole 3 (refer to FIG. 1C). The second insulating film 4 is a silicon oxide film that is formed from a material different from that of the first insulating film 2 formed of silicon nitrides. The second insulating film 4 is formed by thermal oxidation of silicon, and has a thickness of 1 μm. The first surface 1a and the second surface 1b of the substrate 1 are covered by the first insulating film 2 formed of silicon nitrides, and hence the second insulating film 4 formed of a silicon oxide is formed only on the inner wall 3a of the through hole 3. Before subjecting the silicon to thermal oxidation, the inner wall 3a of the through hole 3 (refer to FIG. 1C) is cleaned by dry etching, chemical solution etching, or the like.

Next, as illustrated in FIG. 1E, the conductive film 5 is formed on an outer surface of the first insulating film 2b. As the conductive film 5, 5 nm of Cr and 1 μm of Cu are deposited in order on the outer surface of the first insulating film 2b by electron beam evaporation.

Next, as illustrated in FIG. 1F, the portion 2d of the first insulating film 2b (refer to FIG. 1E) is processed so that the portion 5a of the conductive film 5 is exposed. Therefore, the portion 2d of the first insulating film 2b formed of a silicon nitride (refer to FIG. 1E) is subjected to RIE processing from the first surface 1a side of the substrate (refer to FIG. 1A) using the dry film resist 6 as a mask. The RIE of the silicon nitride is carried out using conditions that hardly damage the silicon oxide. Further, the opening 6a of the dry film resist 6 is set to be smaller than both the opening 2c of the first insulating film 2a (refer to FIG. 1C) and the opening 3b of the through hole 3 (refer to FIG. 1C). Consequently, during the processing of the portion 2d of the insulating film 2b, the second insulating film 4 suffers almost no damage, and the silicon substrate 1 is not exposed in the through hole 3.

Next, as illustrated in FIG. 1G, an inner portion of the through hole 3 is filled with a conductive material 7 by electrolytic plating using the conductive film 5 as a seed layer. To ensure the reliability of electrical connection, the conductive material 7 is made to protrude from the opening 2c of the first insulating film 2a (refer to FIG. 1C). During the electrolytic plating, plating solution is circulated through the through hole from the opening 3b of the through hole 3, and the conductive material 7 grows from the portion 5a of the conductive film as a starting point. The plating of the conductive material 7 is Cu electrolytic plating in which copper sulfate is the main liquid. During plating, in order to carry out plating growth from only the portion 5a of the conductive film 5 as the starting point, the surface of the conductive film 5 formed on the outer side of the through hole 3 is protected with an insulating material.

Next, as illustrated in FIG. 1H, for the purpose of electrical connection, both end surfaces 7a and 7b of the conductive material 7 are flattened so that both end surfaces 7a and 7b are at roughly the same height as the surfaces of the first insulating film 2a and 2b, respectively. To carry out the flattening, CMP processing is performed on both the first surface 1a side (refer to FIG. 1A) and the second surface 1b side (refer to FIG. 1A) of the substrate 1. The resultant conductive material 7 whose end surfaces have been processed in this manner serves as the through wiring.

Through use of the steps described above, the same effects as in the first embodiment can be enjoyed.

EXAMPLE 2

Example 2 of the present invention, which is another detailed example of a method of forming a through wiring according to the present invention, is described with reference to FIGS. 2A to 2H. A detailed description of parts that are similar to Example 1 is omitted. First, similarly to Example 1, the silicon substrate 1 illustrated in FIG. 1A is prepared.

Next, as illustrated in FIG. 2A, insulating film 8 and insulating film 2 are formed in order on the first surface 1a (refer to FIG. 1A) and the second surface 1b (refer to FIG. 1A) of the substrate 1. The insulating film 8a and the insulating film 2a are each formed on the first surface 1a, and the insulating film 8b and the insulating film 2b are each formed on the second surface 1b. The insulating film 8 (including 8a and 8b; hereinafter the same) is a thermal oxidation film of silicon formed by thermally oxidizing the surface of the silicon substrate, and has a thickness of 1.0 µm. The insulating film 2 (including 2a and 2b; hereinafter the same) is a silicon nitride film formed by a CVD method, and has a thickness of 0.4 µm. The insulating film 8 and the insulating film 2 form the first insulating film.

Next, as illustrated in FIG. 2B, the through hole 3 is formed. Processing of the through hole 3 is carried out from the first surface 1a side of the substrate 1 (refer to FIG. 1A). In the processing of the through hole 3, first, a 200 nm Cr film (not shown) is formed on the upper surface of the insulating film 2a by a sputtering method. After performing photolithography, a photoresist pattern (not shown) is transferred onto the Cr film (not shown) by plasma etching including chlorine, to expose a surface corresponding to the opening 2c of the insulating film 2a. In addition, RIE processing is carried out until the portion 8d of the insulating film 8b is exposed at a bottom portion of the through hole using the Cr film (not shown) having the opening as an etching mask. Note that, the processing conditions and the etching gas used in the RIE processing of the opening 2c of the insulating film 2a, the opening 8c of the insulating film 8a, and the through hole 3 are respectively different.

Next, as illustrated in FIG. 2C, the portion 8d of the insulating film 8b is processed so that the portion 2d of the insulating film 2b is exposed. The processing of the portion 8d of the insulating film 8b is carried out based on the same method and using the same etching mask as the processing of the opening 8c of the insulating film 8a illustrated in FIG. 2B. After the processing of the portion 8d of the insulating film 8b, the etching mask formed on the upper surface of the insulating film 2a is removed.

Next, as illustrated in FIG. 2D, the second insulating film 4 is formed on the inner wall 3a of the through hole 3 (refer to FIG. 2C). In contrast to the first insulating film 2, which is a silicon nitride film, the second insulating film 4 is a silicon oxide film. The second insulating film 4 is an oxidation film of silicon formed by thermally oxidizing the silicon inner wall 3a of the through hole 3 (refer to FIG. 2C), and has a thickness of 1.0 µm. During thermal oxidation, the uppermost surface of the substrate 1 is the first insulating film 2 formed of silicon nitrides, and hence the second insulating film 4 is formed only on the inner wall 3a of the through hole 3 (refer to FIG. 2C).

Next, as illustrated in FIG. 2E, the conductive film 5 is formed on the outer surface of the first insulating film 2b. The configuration and the formation method for the conductive film 5 are the same as that described with reference to FIG. 1E in Example 1.

Next, as illustrated in FIG. 2F, the portion 2d of the first insulating film 2b is processed so that, as seen from the opening 3b of the through hole (refer to FIG. 2C), the portion 5a of the conductive film 5 is exposed. The processing method is the same as the method described with reference to FIG. 1F in Example 1. The area of the portion 5a of the conductive film 5 is smaller than the inner diameter of the through hole 3 including the second insulating film 4 on the inner wall 3a so that the second insulating film 4 is almost not damaged in processing the portion 2d.

Next, as illustrated in FIG. 2G, the inner portion of the through hole 3 is filled with a conductive material 7 by electrolytic plating using the conductive film 5 as a seed layer. To ensure the reliability of electrical connection, the conductive material 7 is made to protrude from the opening 2c of the insulating film 2a (refer to FIG. 2D). The plating method is the same as the method described with reference to FIG. 1G in Example 1.

Next, as illustrated in FIG. 2H, for the purpose of electrical connection, both end surfaces 7a and 7b of the conductive material 7 are flattened so that both end surfaces 7a and 7b are at roughly the same height as the surfaces of the first insulating film 2a and 2b, respectively. To carry out the flattening, CMP processing is performed on both the first surface 1a side (refer to FIG. 1A) and the second surface 1b side (refer to FIG. 1A) of the substrate 1. The resultant conductive material 7 whose end surfaces have been processed in this manner serves as the through wiring.

Through use of the steps described above, the same effects as in the second embodiment can be enjoyed.

A through wiring substrate having a through wiring obtained by the above-mentioned forming methods can be applied in various devices and systems including an LSI chip and a micro machine device. Using such a through wiring substrate enables devices and systems to be more compact, have a higher density, and have higher functionality. For example, in the above-mentioned method of forming a through wiring, a capacitive transducer (CMUT: capacitive micromachined ultrasonic transducer) can be manufactured on the substrate using a micromachining technology. With such a CMUT, acoustic waves (including waves called sonic waves, ultrasonic waves, and photoacoustic waves), can be transmitted onto and received from a test object using the vibrations of a diaphragm. In particular, excellent broadband characteristics can be obtained in liquids. In practice, a CMUT realizes a desired performance by constructing a transducer through arrangement of a plurality of elements on a substrate, each element being formed from a plurality of diaphragms arranged in a two-dimensional array. In this configuration, in order to independently control each element, a wiring electrode corresponding to each element needs to be formed. Here, to reduce the size and to reduce the parasitic capacitance of the wiring electrode, it is preferred to utilize a through wiring passing through the substrate. The above-mentioned methods realize such a through wiring.

According to the method of forming a through wiring according to one embodiment of the present invention, by forming the seed layer after the second insulating film is formed on the inner wall of the through hole, there are fewer limitations on the formation method and the formation conditions of the second insulating film, and a higher-quality second insulating film can be formed. Further, the second insulating film on the inner wall of the through hole is formed from a material different from that of the first insulating film on the seed layer. Therefore, during etching carried out to expose the seed layer at the bottom portion of the through hole, the second insulating film can be prevented from suffering almost any damage. Consequently, deterioration in the insulating performance of the second insulating film on the inner wall of the through hole can be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-028270, filed Feb. 18, 2014, which is hereby incorporated by reference herein in its entirety.

What is claimed is:

1. A method of forming a through wiring in a substrate using electrolytic plating, the method comprising, in stated order, steps (1)-(6):
   (1) forming a first insulating film on a first surface and a second surface of the substrate, the first surface and the second surface being located at opposite sides of the substrate from each other;
   (2) forming a through hole to pass through the first insulating film formed on a first surface side and the substrate so that at least a part of the first insulating film formed on the second surface remains;
   (3) forming a second insulating film on an inner wall of the through hole, the second insulating film being formed from a material different from a material of the first insulating film;
   (4) forming a conductive film on the first insulating film formed on the second surface;
   (5) forming an opening in the first insulating film by processing the first insulating film formed on the second surface from the first surface side so that the conductive film is exposed at a terminus of the through hole on a second surface side; and
   (6) filling an inner portion of the through hole with a conductive material by electrolytic plating using the conductive film exposed at the terminus of the through hole as a seed layer.

2. The method according to claim 1, further comprising forming, between the substrate and the first insulating film, another first insulating film formed from a material different from the material of the first insulating film.

3. The method according to claim 2, wherein the first insulating film comprises a multilayer film formed from two or more types of materials.

4. The method according to claim 1, wherein the second insulating film comprises a multilayer film formed from two or more types of materials.

5. The method according to claim 1, wherein the substrate comprises a semiconductor substrate.

6. The method according to claim 5,
   wherein the substrate comprises silicon,
   wherein the first insulating film comprises a silicon nitride film, and
   wherein the second insulating film comprises a silicon oxide film.

7. The method according to claim 1, wherein the first insulating film comprises one of a single layer film of a silicon nitride or a silicon oxide, and a multilayer film of a silicon nitride and a silicon oxide.

8. The method according to claim 7, wherein on the first surface side and the second surface side of the substrate, the silicon oxide and the silicon nitride of the first insulating film comprising a multilayer film have the same thickness and are simultaneously formed.

9. The method according to claim 1, wherein the opening of the first insulating film formed on the second surface at the terminus of the through hole has a smaller diameter than a diameter formed between any two facing points of the second insulating film formed on the inner wall of the through hole.

10. The method according to claim 9, wherein in the forming the opening by processing the first insulating film on the second surface, an opening of an etching mask to be formed on the first surface above the through hole has a smaller diameter than the opening of the first insulating film formed when forming the through hole.

11. The method according to claim 1,
   wherein during formation of the through hole, the first insulating film formed on the first surface and the substrate are processed in order using a photoresist pattern as an etching mask, and
   wherein the through hole is processed to pass through the substrate using a reactive ion etching method.

12. The method according to claim 1, wherein the conductive film comprises a metal layer.

13. The method according to claim 12, wherein the conductive film comprises an adhesion layer with the first insulating film formed on the second surface and the metal layer.

14. The method according to claim 13, wherein the conductive film comprises a bilayer film formed of Cr and Cu in order on the first insulating film formed on the second surface.

15. The method according to claim 1, wherein both the first surface side and the second surface side of the substrate are processed so that both end surfaces of the conductive material are exposed.

16. The method according to claim 1, further comprising manufacturing a device on the first insulating film, the device comprising an electrode that is electrically connected to the through wiring.

17. The method according to claim 16, wherein the device comprises a capacitive transducer configured to receive acoustic waves from a test object.

18. A method of forming a through wiring in a substrate using electrolytic plating, the method comprising:
   forming a first insulating film on a first surface and a second surface of the substrate, the first surface and the second surface being located at opposite sides of the substrate from each other;
   forming a through hole to pass through the first insulating film formed on a first surface side and the substrate so that at least a part of the first insulating film formed on the second surface remains;
   forming a second insulating film on an inner wall of the through hole;
   forming a conductive film on the first insulating film formed on the second surface;
   forming an opening in the first insulating film by processing the first insulating film formed on the second surface from the first surface side so that the conductive film is exposed at a terminus of the through hole on a second surface side; and
   filling an inner portion of the through hole with a conductive material by electrolytic plating using the conductive film exposed at the terminus of the through hole as a seed layer,
   wherein the forming of the second insulating film is performed prior to the forming of the conductive film.

19. The method according to claim 18, further comprising forming, between the substrate and the first insulating film, another first insulating film formed from a material different from the material of the first insulating film.

20. The method according to claim 18, wherein the first insulating film comprises a multilayer film formed from two or more types of materials.

21. The method according to claim 18, wherein the second insulating film comprises a multilayer film formed from two or more types of materials.

22. The method according to claim 18, wherein the substrate comprises a semiconductor substrate.

23. The method according to claim 22,
wherein the substrate comprises silicon,
wherein the first insulating film comprises a silicon nitride film, and
wherein the second insulating film comprises a silicon oxide film.

24. The method according to claim 18, wherein the first insulating film comprises one of a single layer film of a silicon nitride or a silicon oxide, and a multilayer film of a silicon nitride and a silicon oxide.

25. The method according to claim 18, further comprising manufacturing a device on the first insulating film, the device comprising an electrode that is electrically connected to the through wiring.

26. The method according to claim 25, wherein the device comprises a capacitive transducer.

* * * * *